(12) United States Patent
Pei et al.

(10) Patent No.: US 6,257,533 B1
(45) Date of Patent: Jul. 10, 2001

(54) CPU HEAT SINK ATTACHMENT

(75) Inventors: Hsien-Shen Pei; Chao-Yang Lee, both of Taipei (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/370,120

(22) Filed: Aug. 6, 1999

(30) Foreign Application Priority Data

Feb. 11, 1999 (TW) .................................. 88202431

(51) Int. Cl.[7] ............................. F16M 11/00; H05K 7/20
(52) U.S. Cl. ................................... 248/200; 361/704
(58) Field of Search .......................... 248/200, 510, 248/505; 361/704, 719

(56) References Cited

U.S. PATENT DOCUMENTS

| | | | | |
|---|---|---|---|---|
| 5,600,540 | * | 2/1997 | Blomquist | 248/510 |
| 5,771,960 | * | 6/1998 | Lin | 361/704 |
| 5,933,326 | * | 8/1999 | Lee et al. | 248/510 |
| 6,025,994 | * | 2/2000 | Chiou | 248/510 |
| 6,061,239 | * | 5/2000 | Blomquist | 361/704 |
| 6,108,207 | * | 8/2000 | Lee | 248/505 |
| 6,111,752 | * | 8/2000 | Huang et al. | 248/505 |
| 6,118,661 | * | 9/2000 | Lo | 361/704 |
| 6,158,707 | * | 12/2000 | Chien | 248/510 |

* cited by examiner

Primary Examiner—Ramon O. Ramirez
Assistant Examiner—J. DeLuca
(74) Attorney, Agent, or Firm—Wei Te Chung

(57) ABSTRACT

An attachment includes an upper locking element and a lower locking element assembled together. The upper locking element comprises a main plate, a folded section, a locking section and a locking tip. The lower locking element comprises a spring section, a first and second arms. Protrusions of the upper locking element engage with holes of the lower locking element, and the locking tip engages with a locking slot of the first arm. The lower locking element is strengthened by the upper locking element. The upper locking element acting as a handle for facilitating an assembly/unassembly process of attaching a heat sink to a CPU package.

6 Claims, 3 Drawing Sheets

CPU HEAT SINK ATTACHMENT

BACKGROUND OF THE INVENTION

The present invention relates to an attachment, and particularly to an attachment for attaching a heat sink to a CPU package.

During operation of a computer, large quantities of heat are generated by electrical elements thereof. Since the processing speed of a CPU is becoming increasingly quick, more heat is generated thereby. Thus, cooling the CPU package is an important consideration facing computer designers.

Taiwan Patent Application No. 86202156 discloses a conventional heat sink attachment. Referring to FIG. 1, the conventional attachment 1 comprises a locking plate 4 and spring sections 2, 3. A first arm 6 extends downwardly from the spring section 2, and a first opening 7 is formed in the first arm 6 proximate a free end thereof. A second arm 5 extends from the spring section 3 opposite the first arm 6, and a second opening 8 is formed proximate a free end of the second arm 5. Thus, the first and second openings 7, 8 are engageable with a pair of locking elements of a socket (not shown) for securing a heat sink to a CPU package. However, the attachment is resilient and has no element to disassemble from the CPU package, so the attachment is unable to provide enough force for securing the heat sink to a CPU package and difficult to be unassembled from the heat sink, thus a new design for a heat sink attachment is requisite.

BRIEF SUMMARY OF THE INVENTION

A main object of the present invention is to provide a heat sink attachment for reliably securing a heat sink to a CPU package and facilitating disassembly process.

To fulfill the above mentioned object, an attachment comprises an upper and a lower locking elements. The upper locking element comprises a main plate, a folded section, a locking section and a locking tip. The main plate forms a pair of protrusions on each lateral edge thereof. The folded section extends from an end of the main plate attaching to a bottom surface thereof. The locking section extends downwardly from the folded section, and the locking tip is formed at a free end of the locking section. The lower locking element comprises a spring section, a first and second arms. A pair of first ears is formed at an end of the spring section, and a pair of second ears is formed at middle portion of the spring section. Each ear has a hole. The first arm is formed proximate the first ear of the spring section, and the second arm is formed at an opposite end of the spring section. The first arm has a locking slot corresponding to the locking tip of the upper locking element. The protrusions engage with the holes of the ears, and the locking tip engages with the locking slot of the first arm.

Other objects, advantages and novel features of the invention will become more apparent from the following detailed description when taken in conjunction with the accompanying drawings.

DETAILED DESCRIPTION OF THE INVENTION

Figure 1:
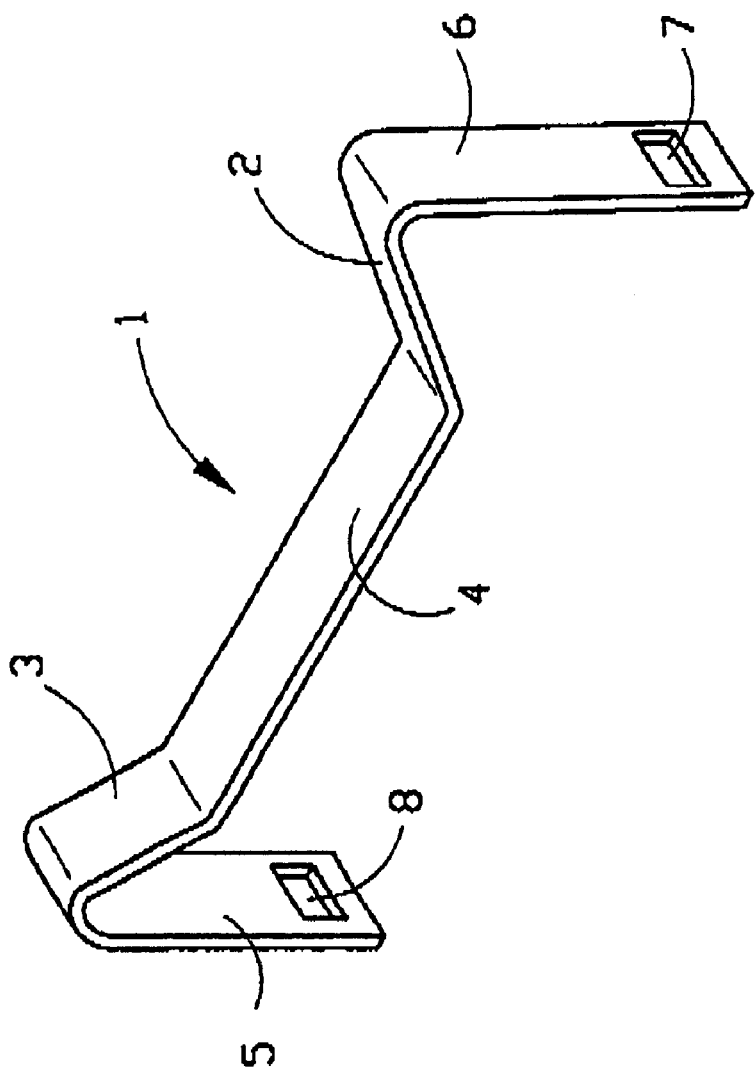
FIG. 1 prespective view of a conventional heat sink attachment.
Figure 2:
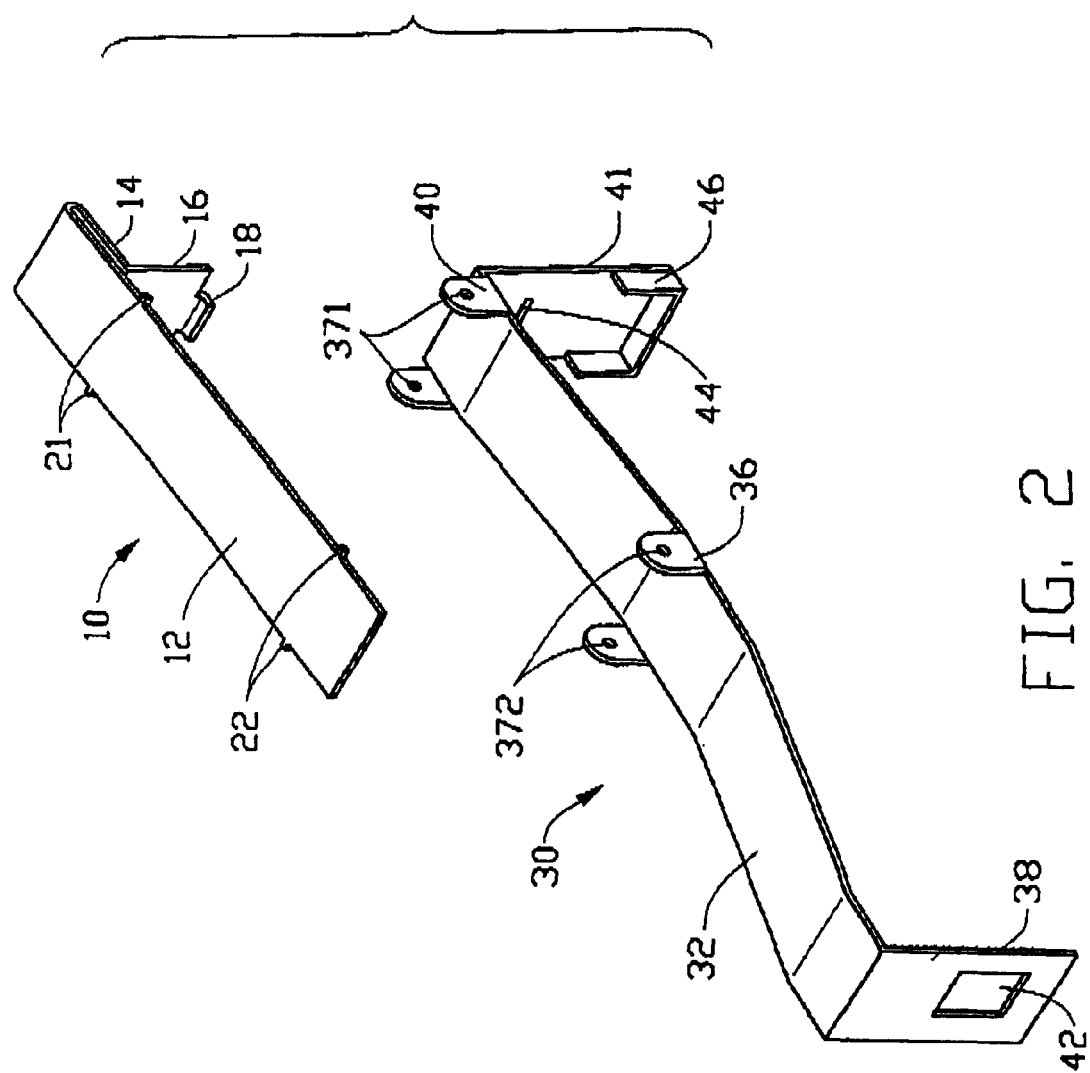
FIG. 2 is an exploded view of a attachment in accordance with the present invention.
Figure 3:
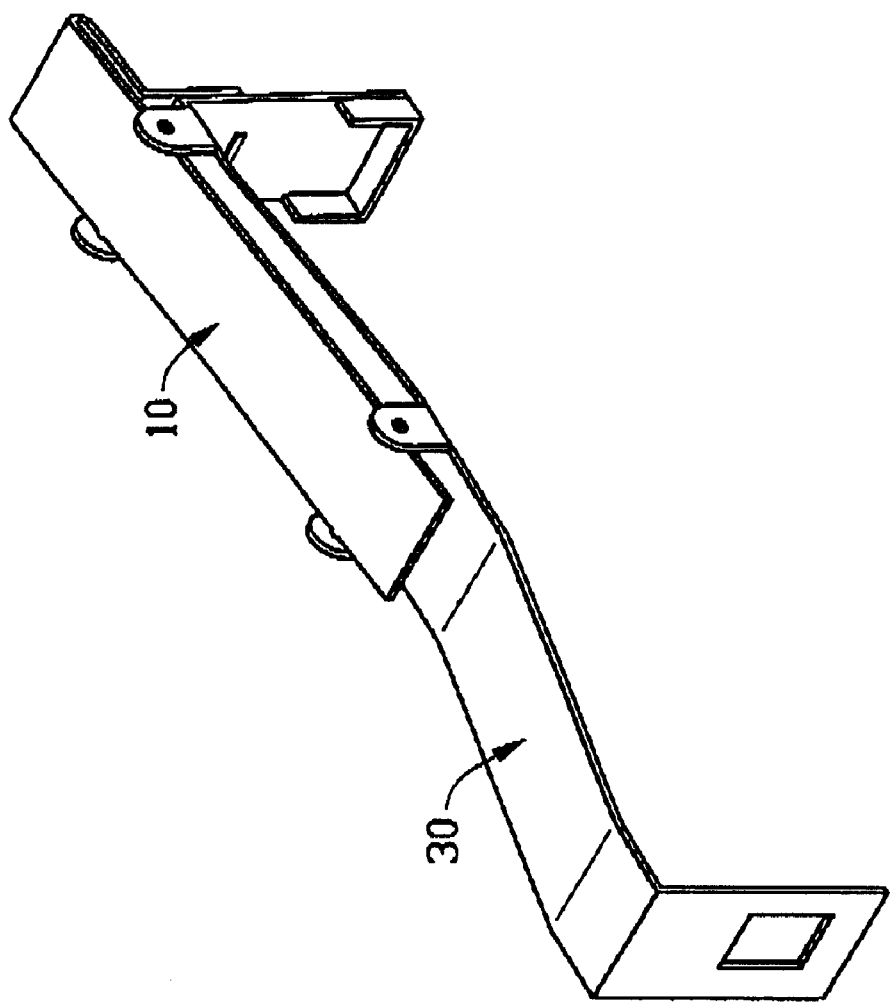
FIG. 3 is an assembled view of FIG. 2.

Referring to FIGS. 2 and 3, an attachment comprises an upper locking element 10 and a lower locking element 30.

The upper locking element 10 comprises a main plate 12, a folded section 14, a locking section 16 and a locking tip 18. Two pairs of protrusions 21, 22 are formed on each lateral edge of the main plate 12, and the folded section 14 extends from an end of the main plate 12 along a bottom surface thereof. The locking section 16 downwardly extends from the folded section 14 and a locking tip 18 formed at a free end thereof. The folded section 14 acts as a handle for facilitating a process of assembly/disassembly a heat sink to a CPU package (not shown) and providing enough spring force for securing the heat sink to the CPU package.

The lower locking element 30 comprises a spring section 32, a first and a second arms 41, 38. A pair of first ears 40 is formed at an end of the spring section, and a pair of second ears 36 is formed at a middle portion of the spring section 32. Each ear has holes 371, 372 respectively for engaging with the corresponding protrusions 21, 22. The first arm 41 downwardly extends from an end of the spring section 32 proximate the first ear 40, and the second arm 38 extends from an opposite end of the spring section 32. An opening 42 is formed in the second arm 38 for engaging with a projection of a socket (not shown). The first arm 41 has a locking slot 44 corresponding to the locking tip 18 of the upper locking element 10. A U-shaped engaging section 46 is defined at a free end of the first arm 41 for engaging with a projection of the socket for securing the heat sink and the CPU package therebetween.

When the upper locking element 10 is assembled to the lower locking element 30 and the attachment is attached to a CPU package, the opening 42 and the U-shaped engaging section 46 close to lateral sides of the CPU package for locking with a pair of corresponding projections of the CPU socket (not shown). The spring section 32 is strengthened by the rigid lower locking element 32. Thus, a heat sink can be reliably secured to the CPU package for effectively cooling. In disassembly, the folded section 14 acts as handle for a person to easily disassemble the first and second arms 41, 38 from locking state.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An attachment for securing a heat sink to a socket of a CPU package, comprising:

a lower locking element having a spring section, a first and a second arms extending from opposite ends of the spring section for engaging with corresponding projections of a socket, a pair of ears formed on each of two lateral edges of the spring section, and a locking slot formed in the first locking arm; and an upper locking element having a main plate, a folded section, a locking section and a locking tip, a pair of protrusions being formed on the main plate for engaging with corresponding ears of the lower locking element, the folded section extending from an end of the main plate along a bottom surface thereof, the locking section downwardly extending from the folded section, the locking tip being engaged with corresponding locking slot of the lower locking element, the folded section acting as a handle manipulatable upwards to disassemble the lower locking element from the socket.

2. The attachment as claimed in claim 1, wherein the main plate is attached to the spring section of the lower locking element for strengthening the lower locking element.

3. The attachment as claimed in claim 1, wherein the first arm has a U-shaped engaging section and the second arm has an opening respectively adapted for engaging with the socket.

4. The attachment as claimed in claim 1, wherein the protrusions are formed on lateral edges of the upper locking element for engaging with corresponding ears formed on lateral edges of the lower locking element.

5. The attachment as claimed in claim 1, wherein the locking section downwardly extends from the folded section and the locking tip is formed at an end of the locking section.

6. An attachment for securing a heat sink to a socket of a CPU package, comprising:

a lower locking element comprising a spring section, a first and second arms extending from opposite ends of the spring section; and an upper locking element fastened to the lower locking element, said upper locking element comprising a main plate positioned atop the spring section, a folded section horizontally extending from the main plate and beyond the spring section in a lengthwise direction thereof for manual operation, and a locking section downwardly extending from the folded section and latchably engaged with a corresponding arm aside;

wherein the upper locking element has protrusions engaging with ears formed on the spring section of the lower locking element thereby fastening the upper locking element to the lower locking element.

* * * * *